(12) United States Patent
Urakawa et al.

(10) Patent No.: US 9,530,657 B2
(45) Date of Patent: Dec. 27, 2016

(54) METHOD OF PROCESSING SUBSTRATE AND SUBSTRATE PROCESSING APPARATUS

(71) Applicant: Tokyo Electron Limited, Tokyo (JP)

(72) Inventors: Masafumi Urakawa, Miyagi (JP); Rui Takahashi, Miyagi (JP); Masahiro Ogasawara, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/529,241

(22) Filed: Oct. 31, 2014

(65) Prior Publication Data

US 2015/0132967 A1    May 14, 2015

(30) Foreign Application Priority Data

Nov. 13, 2013 (JP) .................. 2013-234871

(51) Int. Cl.
- *H01L 21/3065* (2006.01)
- *H01L 21/67* (2006.01)
- *H01J 37/32* (2006.01)
- *H01L 21/683* (2006.01)

(52) U.S. Cl.
CPC ..... *H01L 21/3065* (2013.01); *H01J 37/32091* (2013.01); *H01J 37/32715* (2013.01); *H01L 21/67109* (2013.01); *H01L 21/6831* (2013.01)

(58) Field of Classification Search
None
See application file for complete search history.

(56) References Cited

U.S. PATENT DOCUMENTS

| | | | | |
|---|---|---|---|---|
| 5,946,184 A | * | 8/1999 | Kanno | H01L 21/6833 279/128 |
| 2007/0275564 A1 | * | 11/2007 | Harada | H01L 21/0273 438/706 |
| 2011/0056514 A1 | * | 3/2011 | Lee | H01J 37/321 134/1.1 |

FOREIGN PATENT DOCUMENTS

JP    2013-149935    8/2013

* cited by examiner

*Primary Examiner* — Shamim Ahmed
(74) *Attorney, Agent, or Firm* — IPUSA, PLLC

(57) ABSTRACT

A method of processing a substrate using a substrate processing apparatus that has an electrostatic chuck including an insulating member inside which an electrode is included and provides a plasma process to a substrate mounted on the electrostatic chuck includes a first process of supplying a heat transfer gas having a second gas pressure to a back surface of the substrate while eliminating electric charges in the substrate using plasma of a process gas having a first gas pressure.

8 Claims, 4 Drawing Sheets

METHOD OF PROCESSING SUBSTRATE AND SUBSTRATE PROCESSING APPARATUS

CROSS-REFERENCE TO RELATED APPLICATIONS

This patent application is based upon and claims the benefit of priority of Japanese Patent Application No. 2013-234871 filed on Nov. 13, 2013, the entire contents of which are incorporated herein by reference.

BACKGROUND OF THE INVENTION

1. Field of the Invention

The present invention relates to a method of processing substrates and a substrate processing apparatus.

2. Description of the Related Art

An example of a substrate processing apparatus is a plasma processing apparatus that provides a predetermined process such as etching to a substrate such as a wafer for a semiconductor device using plasma. The plasma processing apparatus is structured by including a treatment container, inside which plasma is generated, a mounting stage provided inside the treatment container and mounting a substrate, an electrostatic chuck (ESC) provided on the mounting stage and supporting the substrate, and so on.

The electrostatic chuck is structured such that both surfaces of a conductive chuck electrode in a sheet-like form are interposed between a dielectric member. At a time of processing the substrate process, a substrate is adsorbed by an adsorption force generated by applying a voltage to the chuck electrode from a direct voltage source while the substrate is mounted on the mounting stage.

Further, in processing the substrate, a process of eliminating electric charges existing in the electrostatic chuck and the substrate is performed. After the electric charge elimination process, the substrate is lifted from the electrostatic chuck using the support pin and subsequently carried out of the substrate processing apparatus as disclosed in, for example, Japanese Laid-open Patent Publication No. 2013-149935.

SUMMARY OF THE INVENTION

According to an aspect of the embodiment of the present invention, there is provided a method of processing a substrate using a substrate processing apparatus that has an electrostatic chuck including an insulating member inside which an electrode is included and provides a plasma process to a substrate mounted on the electrostatic chuck including a first process of supplying a heat transfer gas having a second gas pressure to a back surface of the substrate while eliminating electric charges in the substrate using plasma of a process gas having a first gas pressure.

DETAILED DESCRIPTION OF EMBODIMENTS

According to the above example of the substrate processing apparatus, a very strong adsorption force may be generated between the substrate and the electric chuck depending on conditions of the substrate process. Therefore, in a case where the electric charge elimination process for the substrate and the electrostatic chuck is performed by a method described in Japanese Laid-open Patent Publication No. 2013-149935 or the like, the adsorption force may remain between the substrate and the electrostatic chuck. In a case where the substrate is lifted up while the adsorption force is remaining between the substrate and the electrostatic chuck, a crack or a misalignment may be generated in the substrate.

A description of embodiments of the present invention is given below, with reference to the FIG. 1 through FIG. 4. The embodiments described below are only examples and the present invention is not limited to the embodiments.

Through all figures illustrating the embodiments, the same references symbols are used for portions having the same function, and repetitive explanations of these portions are omitted.

Reference symbols typically designate as follows:

1: plasma processing apparatus;
10: treatment container;
12: mounting stage (lower electrode);
28: evacuation device;
32: high-frequency power source;
38: shower head (upper electrode);
40: electrostatic chuck (ESC);
40a: chuck electrode;
40b, 40c: dielectric layer (dielectric member);
42: direct voltage source;
52: heat transfer gas supplying source;
62: gas supplying source;
71: chiller unit;
75: heater;
80: monitor;
81: support pin;
84: motor;
100: control unit; and
W: wafer.

(Substrate Processing Apparatus)

At first, a structural example of a substrate processing apparatus which can perform a method of processing a substrate is described. The substrate processing apparatus of the embodiment is not specifically limited and may be a plasma processing apparatus of a parallel flat plate type (a capacitance coupling type) which can provide a semiconductor wafer W (hereinafter, referred to as a wafer W) to be processed with a reactive ion etching (RIE) process or a plasma process.

Figure 1:
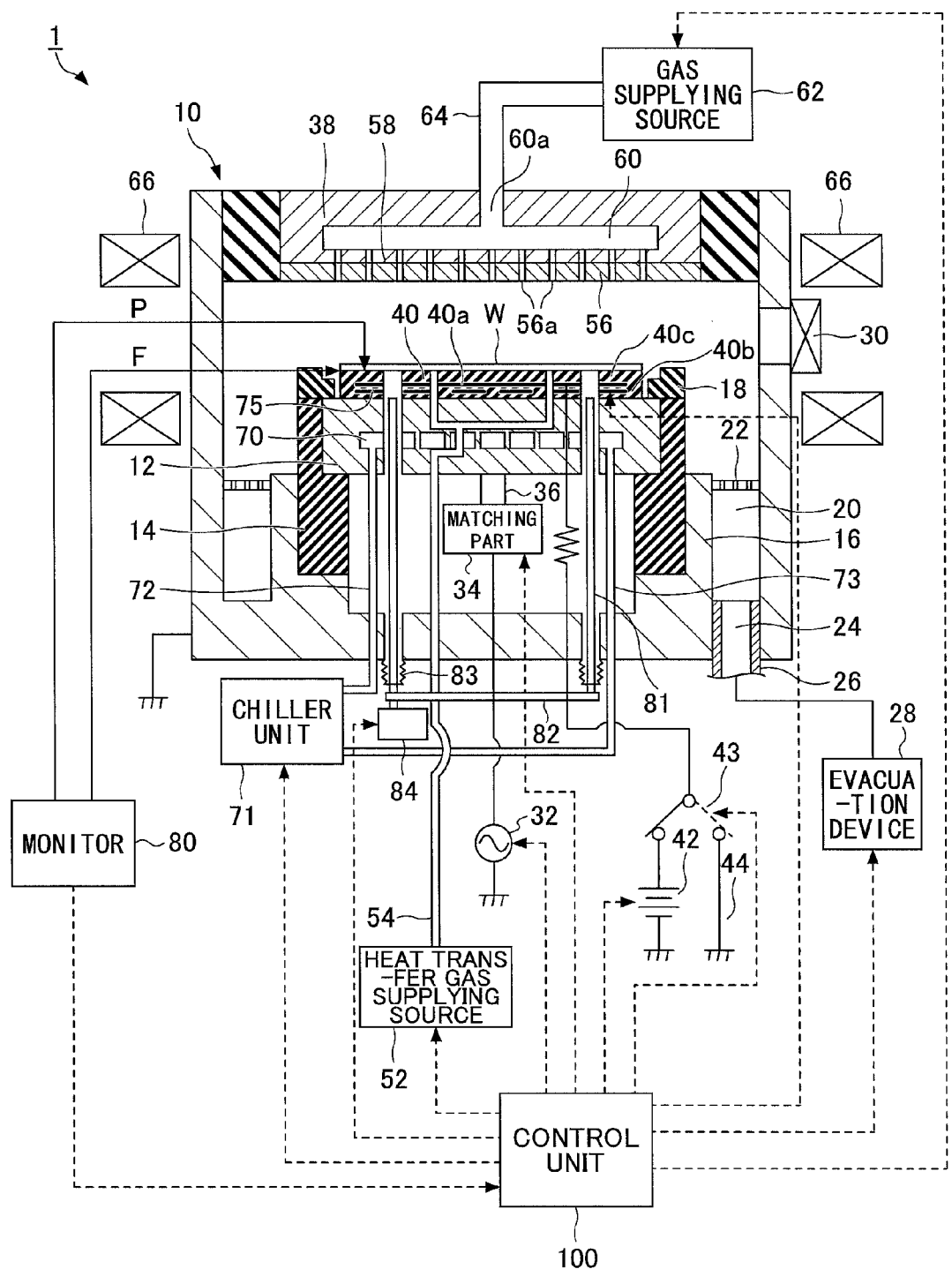
FIG. 1 schematically illustrates an exemplary structure of a substrate processing apparatus of the embodiment.

FIG. 1 schematically illustrates an exemplary structure of the substrate processing apparatus of the embodiment.

The substrate processing apparatus 1 of the embodiment includes a cylindrical chamber (a treatment container 10) made of a metal such as aluminum or stainless steel. The treatment container 10 is ordinarily grounded. Inside the treatment container 10, the method of processing substrate of the embodiment or a plasma process such as etching is provided for an object to be processed.

Inside the treatment container 10, a mounting stage 12 for mounting the wafer W as the object to be processed is provided. The mounting stage 12 is made of, for example, aluminum, titanium, SiC, or the like and is supported by a cylindrical supporter 16 extending in a vertical upward direction from the bottom of the treatment container 10 through an insulative cylindrical holder 14. A focus ring 18 covers the upper surface of the cylindrical holder 14 in a ring-like shape and is made of, for example, quartz. The focus ring 18 converges plasma generated above the mounting stage 12 onto the wafer 12.

An evacuation path 20 is formed between the inner sidewall of the treatment container 10 and the outer sidewall of the cylindrical supporter 16. A ring-like baffle plate 22 is attached to the evacuation path. An evacuation port 24 is provided on the bottom of the evacuation path 20 and is connected to the evacuation device 28 through an evacuation pipe 26.

The evacuation device 28 includes a vacuum pump (not illustrated) for depressurizing the inside of the treatment container to have a predetermined degree of vacuum. A gate valve 30 provided in the sidewall of the treatment container 10 opens or closes at a time of carrying in and out the wafer W.

A high-frequency power source 32 is electrically connected to the mounting stage 12 through a feed rod 36 and a matching part 32. The high-frequency power source 32 applies a high-frequency power of, for example, 60 MHz to the mounting stage. The mounting stage 12 functions also as a lower electrode.

A shower head 38, as an upper electrode having the ground potential, is provided in the ceiling of the treatment container 10. A high-frequency power for generating plasma supplied from the high-frequency power source 32 is applied between the mounting stage 12 and the shower head 38 so as to form a capacitor.

An electrostatic chuck (ESC) 40 is provided on the upper surface of the mounting stage 12 so as to hold the wafer W by an electrostatic adsorption force. The electrostatic chuck 40 is formed by interposing a sheet-like chuck electrode 40$a$ formed by a conductive film between a pair of dielectric layers 40$b$ and 40$c$. The direct voltage source 42 is connected to the chuck electrode 40$a$ through a switch 43. A mounting surface of the electrostatic chuck 40 for mounting the wafer 40 ordinarily has protrusions and recesses. These protrusions and recesses may be formed by embossing the electrostatic chuck 40.

The electrostatic chuck 40 holds by adsorbing the wafer W onto the electrostatic chuck 40 by the adsorption force when a voltage is applied from the direct voltage source 42. In a case where the voltage is not applied to the chuck electrode 40$a$, the switch 43 is switched over a ground 44. Hereinafter, a state where the voltage is not applied to the chuck electrode 40$a$ means a state where the chuck electrode 40$a$ is grounded.

The electrostatic chuck 40 includes an electrostatic chuck of a coulomb type of which volume resistivity of the dielectric layers 40$b$ and 40$c$ is equal to or greater than $1 \times 10^{14}$ Ωcm, an electrostatic chuck of a Johnsen-Rahbeck (JR) force type of which volume resistivity is from about $1 \times 10^{9}$ to about $1 \times 10^{12}$ Ωcm, and an electrostatic chuck of a Johnsen-Rahbeck (JR) force type and (+) a coulomb type, of which volume resistivity is from about $1 \times 10^{12}$ to about $1 \times 10^{14}$ Ωcm. The method of processing substrate described below is applicable to any type of such an electrostatic chuck.

A heat transfer gas supplying source 52 supplies a heat transfer gas such as helium (He) to the back surface of the wafer W on the electrostatic chuck 40 through a gas supplying line 54.

The shower head 38 provided in the ceiling includes an electrode plate having a large number of gas vents 56$a$ and an electrode supporter 58 supporting the electrode plate 56 so as to be attachable or detachable. A buffer chamber 60 is provided inside the electrode supporter 58. A gas supplying source 62 is connected to a gas introducing port 60$a$ of the buffer chamber 60 through a gas supplying pipe 64. With this structure, a desired process gas is supplied inside the treatment container 10 from the shower head 38.

Multiple support pins 81, for example, three support pins 81 are provided in the mounting stage 12. The support pins lift up and down the wafer W for sending and receiving the wafer W to and from a transfer arm (not illustrated) provided in the outside of the mounting stage 12. The multiple support pins 81 moves up and down by a motive force of a motor 84 transferred through a connecting member 82. A bottom bellows 83 is provided in a through hole for inserting a support pin 81 that penetrates the cylindrical supporter 16 toward the outside of the treatment container 10 to achieve air sealing between the vacuum side and the atmosphere side of the treatment container 10.

Two magnets 66 in a ring-like shape or a concentric shape are vertically arranged around a periphery of the treatment container 10. Inside the treatment container 10, there is a plasma generation space between the showerhead 38 and the mounting stage 12. In the plasma generation space, a RF electric field is formed in the vertical direction by the high-frequency power source 32, and the high density plasma is generated in the vicinity of the surface of the mounting stage 12 by high-frequency discharge.

A refrigerant pipe 70 is ordinarily provided inside the mounting stage 12. A refrigerant having a predetermined temperature is supplied from a chiller unit 71 through pipes 72 and 73 and circulated in the refrigerant pipe 70. A heater 75 is embedded inside the electrostatic chuck 40. A desired alternating-current voltage is applied from an alternating-current source (not illustrated). With cooling by the chiller unit 71 and heating by the heater 75, a process temperature of the wafer W on the electrostatic chuck 40 is adjusted to be a predetermined temperature.

The substrate processing apparatus 1 may be structured to include a monitor 80 for monitoring the pressure of the heat transfer gas supplied onto the back surface of the wafer W and the leakage flow rate of the heat transfer gas leaking from the back surface of the wafer W. When the pressure of the heat transfer gas is monitored, the pressure value of the heat transfer gas is measured by a pressure sensor (not illustrated) attached to the back surface of the wafer W. The leakage flow rate F of the heat transfer gas is measured by a flow rate sensor attached in the vicinity of, for example, the side surface of the wafer W.

The substrate processing apparatus 1 includes a control unit 100 for controlling operations of elements of the substrate processing apparatus 1 such as the gas supplying source 62, the evacuation device 28, the heater 75, the direct voltage source 42, the switch 43, the matching part 34, the high-frequency power source 32, the heat transfer gas supplying source 52, the motor 84, the chiller unit 71, and so on.

The control unit 100 includes a central processing unit (CPU), a read only memory (ROM), a random access memory (RAM), and so on (not illustrated). The CPU performs the method of processing a substrate described below in accordance with various recipes stored in memory areas of the CPU, the ROM, and the RAM. The recipes include control information of the apparatus concerning process conditions such as the processing time, the pressure (the evacuated gas), the high-frequency power, the voltage, the process gas flow rate, the chamber temperatures (e.g., the upper electrode temperature, the chamber sidewall temperature, and the ESC temperature). Programs and the recipes indicating the processing conditions may be stored in a hard disk or a semiconductor memory or are configured to be set at a predetermined position of a memory area in a state where the programs and the recipes are stored in a recording medium such as a CD-ROM or a DVD which is portable.

(Problems Related to Electrostatic Chuck)

Problems related to the substrate processing apparatus of the embodiment are described with reference to the figures. Within this embodiment, the dielectric member (the dielectric layers 40b and 40c) of the electrostatic chuck 40 is described using a model of a dielectric member formed by thermally spraying yttria ($Y_2O_3$) having a volume resistivity of about $1 \times 10^{14}$ Ωcm.

At first, an example of using a new or problem-free electrostatic chuck is described with reference to (a-1), (a-2), and (a-3) of FIG. 2.

Figure 2:
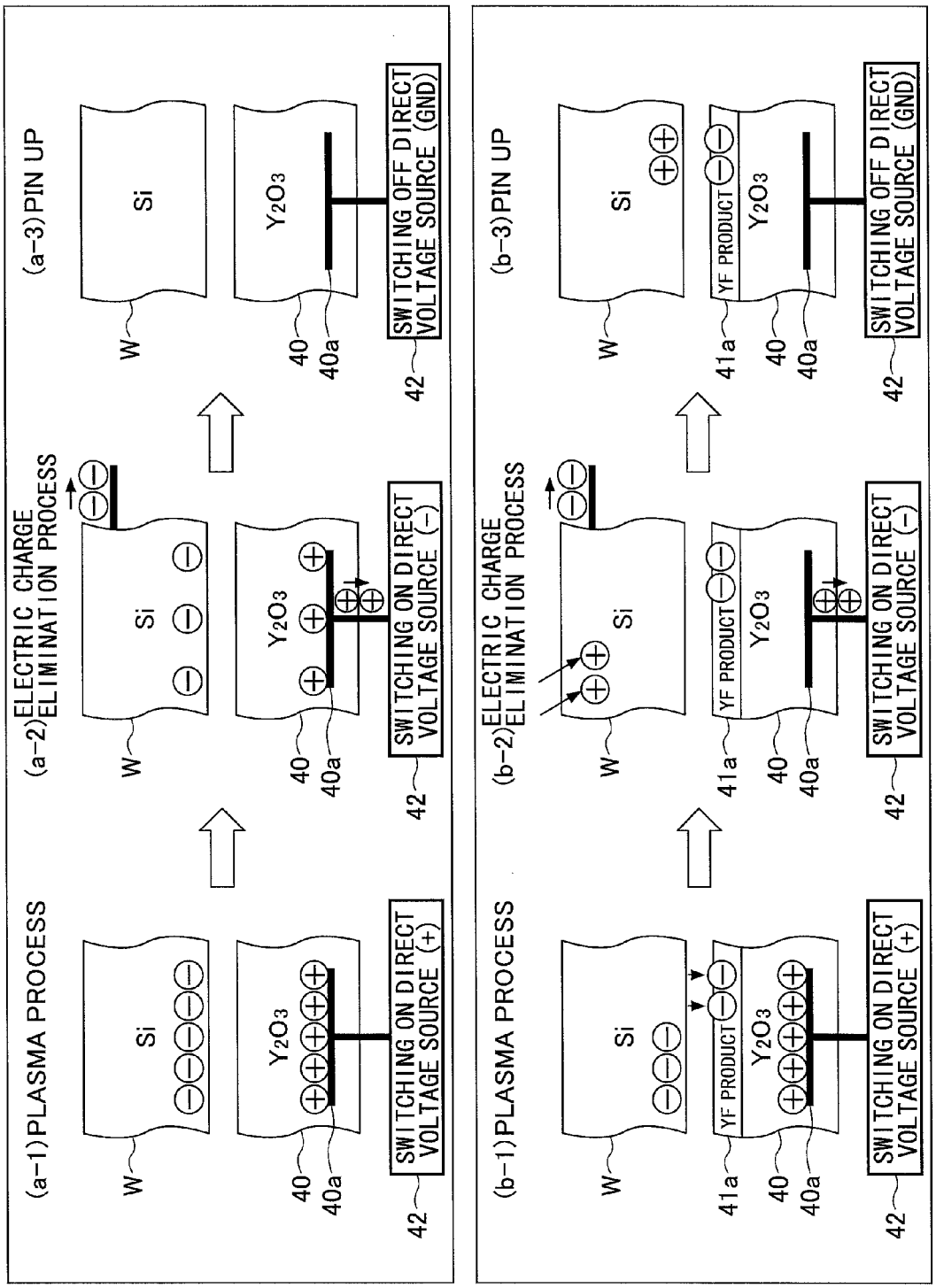
FIG. 2 schematically illustrates electrical states between the electrostatic chuck and the wafer.

FIG. 2 schematically illustrates electrical states between the electrostatic chuck and the wafer. Referring to (a-1) of FIG. 2, an exemplary electric state at a time of the plasma processing is illustrated. Referring to (a-2) of FIG. 2, an exemplary electric state at a time of the electric charge elimination process is illustrated. Referring to (a-3) of FIG. 2, an exemplary electric state at a time of lifting up the wafer by the support pin is illustrated.

The electrostatic chuck 40 is structured such that the chuck electrode 40a in a sheet-like form is interposed inside the dielectric member made of $Y_2O_3$. Application of a voltage is turned on or off to the chuck electrode 40a from the direct voltage source 42.

Referring to (a-1) of FIG. 2, an exemplary positive direct voltage is applied by the direct voltage source 42 at the time of the plasma processing. With this, the chuck electrode 40a has positive electric charges, and the wafer W mounted on the upper surface of the electrostatic chuck 40 has negative electric charges. The positive electric charges and the negative electric charges are counterbalanced to generate the adsorption force corresponding to the potential difference. Thus, the wafer W is adsorbed and held by the electrostatic chuck 40.

Further, at the time of the electric charge elimination process with reference to (a-2) of FIG. 2, a negative direct voltage inverse to the positive direct voltage applied to the chuck electrode 40a at the time of the plasma process is applied to the chuck electrode 40a by the direct voltage source 42. In this process, the positive electric charges are eliminated from the chuck electrode 40a and simultaneously the negative electric charges are eliminated from the wafer W. As illustrated in (a-3) of FIG. 2, the wafer W can be lifted up from the mounting stage while the residual electric charges are not left in the chuck electrode 40a and the wafer W.

Next, an example of using a degraded electrostatic chuck is described with reference to (b-1), (b-2), and (b-3) of FIG. 2. Referring to (b-1) of FIG. 2, an exemplary electric state at a time of the plasma processing is illustrated. Referring to (b-2) of FIG. 2, an exemplary electric state at a time of the electric charge elimination process is illustrated. Referring to (b-3) of FIG. 2, an exemplary electric state at a time of lifting up the wafer by the support pin is illustrated.

In (b-1), (b-2), and (b-3) of FIG. 2, a reaction product 41a is gradually deposited on a surface layer of the electrostatic chuck 40 by a plasma process or the like. As an example, in a case where $Y_2O_3$ is used as a dielectric member of the electrostatic chuck 40 and a plasma process is performed using a fluorine-containing gas, an yttrium fluoride reaction product 41a (an YF reaction product) is formed on the surface layer of the electrostatic chuck 40.

Referring to (b-1) of FIG. 2, an exemplary positive direct voltage is applied to the chuck electrode 40a by the direct voltage source 42 at the time of the plasma processing. With this, the chuck electrode 40a has positive electric charges, and the wafer W mounted on the upper surface of the electrostatic chuck 40 has negative electric charges. However, because the YF reaction product 41a has a small volume resistivity, the negative electric charges in the wafer W may move onto the YF reaction product 41a through a gas component or the like inside a treatment chamber.

Further, at the time of the electric charge elimination process with reference to (b-2) of FIG. 2, a negative direct voltage inverse to the positive direct voltage applied at the time of the plasma process is applied to the chuck electrode 40a by the direct voltage source 42. However, because a change of potential is slow in the reaction product 41a, residual electric charges are left at the time of the electric charge elimination process. At this time, positive residual electric charges corresponding to the negative residual electric charges left in the YF reaction product 41a are supplied again through gas components inside the treatment container 10.

In a case where the wafer W is lifted up while the adsorption force caused by the residual electric charges is left as illustrated in (b-3) of FIG. 2, a crack or a misalignment may occur in the wafer W. When the film thickness of the YF reaction product 41a increases, the residual electric charges also increase to thereby increase an adsorption force. Therefore, a risk of the crack of the wafer, the misalignment, or the like becomes conspicuous. Accordingly, a method of processing the substrate enabling the chuck electrode 40a and the wafer W to be securely eliminated is extremely important.

(Method of Processing the Substrate of the Embodiment)

Based on the above background, the method of processing the substrate of the embodiment by which electric charges are securely eliminated from the chuck electrode 40a and the wafer W is described. The method of processing the substrate is controlled by the control unit 10.

Figure 3:
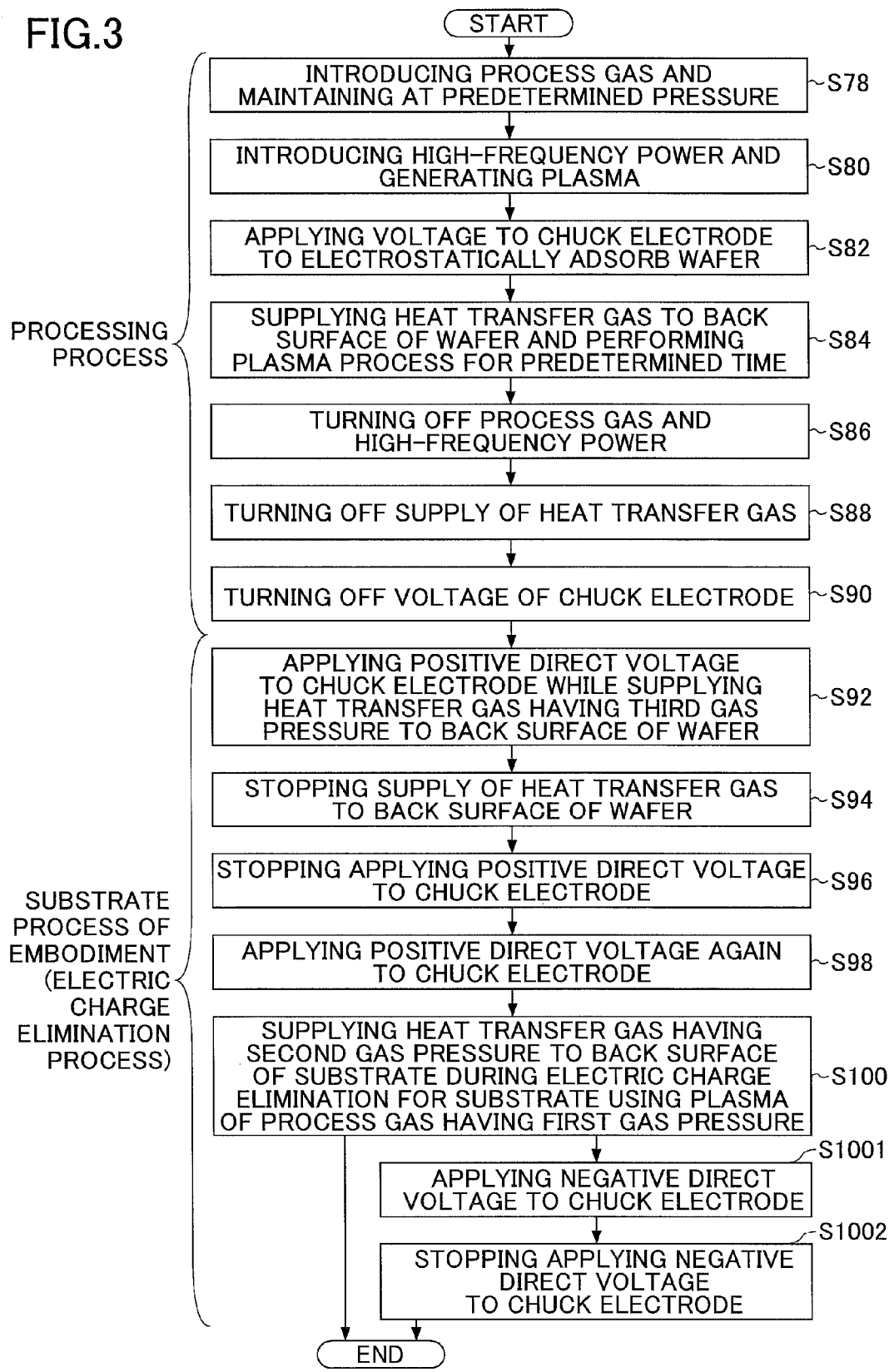
FIG. 3 is a flowchart of an exemplary method of processing a substrate of the embodiment.

FIG. 3 is a flowchart of an exemplary method of processing the substrate of the embodiment. The method of processing the substrate of the embodiment illustrated in FIG. 3 is a preferable method, and it is not always necessary to perform all processes.

The method of processing the substrate (a substrate process) is performed after a processing process (a plasma process) for the substrate. Therefore, an exemplary processing process of the substrate is firstly described.

The wafer W is carried in the treatment chamber. When the plasma process is started, a process gas is introduced into the treatment chamber and the inside of the treatment chamber is maintained to have a predetermined pressure (step S78). Next, the high-frequency power is introduced inside the treatment chamber to generate the plasma (step S80). After generating the plasma, application of a voltage to the chuck electrode 40a is turned on to cause the wafer to be electrostatically adsorbed (step S82). A heat transfer gas is supplied between the back surface of the wafer W and the front surface of the electrostatic chuck 40. In this state, the plasma process is performed for a predetermined time (step S84). After the plasma process is completed, the supply of the process gas and the application of the high-frequency power are turned off (step S86), the supply of the heat transfer gas is turned off (step S88) and the application of the voltage to the chuck electrode 40a is turned off (step S90).

As described, the plasma process is completed and the substrate process of the embodiment is performed. As illustrated in FIG. 3, the method of processing the substrate uses a substrate processing apparatus that includes an electrostatic chuck including an insulating member and an electrode for providing a plasma process to the substrate, and the method of processing the substrate includes a first process (S100) of supplying a heat transfer gas having a second gas pressure to the back surface of the substrate while eliminating electric charges using plasma of a process gas having a first gas pressure.

Preferably, the method of processing the substrate includes a second process before step S100, wherein the second process includes a step of applying a positive direct voltage to the chuck electrode while the supplying heat transfer gas having a third gas pressure to the back surface of the wafer (step S92), a step of stopping the supply of the heat transfer gas to the back surface of the wafer (step S94), a step of stopping applying the positive direct voltage to the chuck electrode (step S96), and a step of applying the positive direct voltage again to the chuck electrode (step S96).

Preferably, the method of processing the substrate includes a step of applying a negative direct voltage to the chuck electrode and a step of stopping the application of the negative direct voltage to the chuck electrode in the first process or between the first and second processes.

Figure 4:
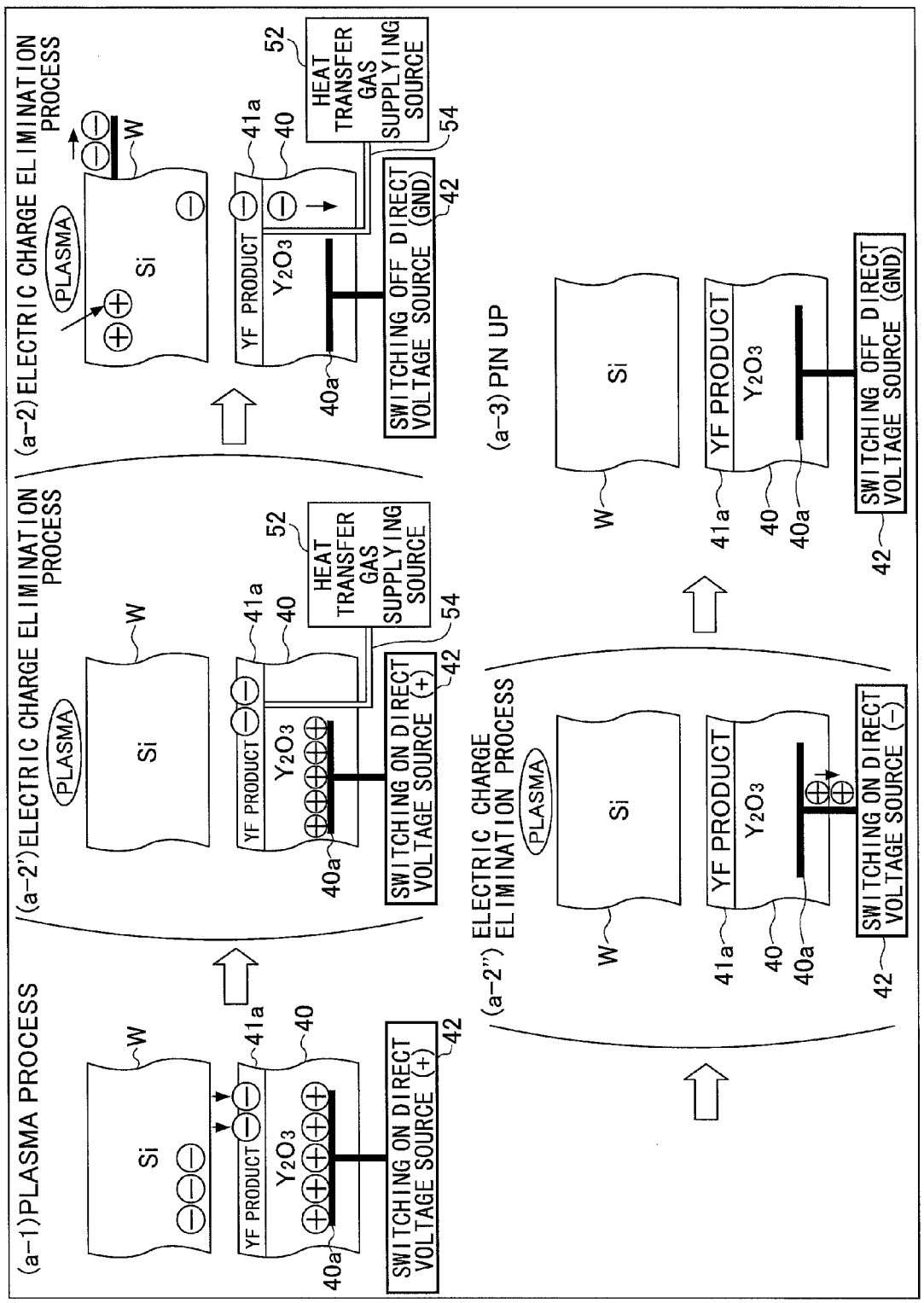
FIG. 4 schematically illustrates electrical states between the electrostatic chuck and the wafer in the method of processing the substrate of the embodiment.

Referring to FIG. 4, the effect of the method of processing substrate of the embodiment is described. FIG. 4 schematically illustrates electrical states between the electrostatic chuck and the wafer in the method of processing the substrate of the embodiment.

Referring to (a-1) of FIG. 4, an electric state at a time of the plasma process is illustrated as in (a-1) of FIG. 2. The positive direct voltage is applied to the chuck electrode 40a by the direct voltage source 42. With this, the chuck electrode 40a has positive electric charges, and the wafer W mounted on the upper surface of the electrostatic chuck 40 has negative electric charges. However, because the YF reaction product 41a has a small volume resistivity, the negative electric charges in the wafer W may move onto the YF reaction product 41a.

Within the embodiment, the heat transfer gas having the second gas pressure is supplied to the back surface of the wafer W while eliminating the electric charges by plasma of the process gas having the first gas pressure as illustrated in (a-2) of FIG. 4 in the electric charge elimination process.

Within the embodiment, the electric charges in the wafer W are eliminated through the process gas and the plasma by using the plasma of the process gas. At the same time, the electric charges moved onto the YF reaction product 41a at the time of the plasma process is eliminated through the heat transfer gas and the gas supplying line 54 for the heat transfer gas. Accordingly, the electric charges in the chuck electrode 40a and the wafer W can be eliminated to be substantially zero as illustrated in (a-3) of FIG. 4.

Further, in the substrate process of the embodiment, the temperature of the electrostatic chuck 40 is lowered by supplying the heat transfer gas. Therefore, the volume resistivity of the dielectric material of the electrostatic chuck becomes low to facilitate removal of the electric charges from the electrostatic chuck 40.

A ratio P2/P1 of the second gas pressure P2 relative to the first gas pressure P1 is not specifically limited as long as greater than 0. From the viewpoint of preventing the wafer W from separating from the mounting stage when the heat transfer gas is supplied to the back surface of the wafer W, the ratio is preferably equal to or smaller than 1.25.

As illustrated in (a-2") of FIG. 4, the negative direct voltage is applied to the chuck electrode 40a while eliminating the electric charges by the plasma of the process gas. With this, the positive electric charge left in the chuck electrode 40a is eliminated, to zero the electric charge in the wafer W and the YF reaction product 41a.

The step of applying the negative direct voltage to the chuck electrode 40a illustrated in (a-2") of FIG. 2 may be performed while supplying the heat transfer gas of the second gas pressure onto the back surface of the wafer W or in a state where the supply of the heat transfer gas is stopped.

Further, the step of applying the negative direct voltage to the chuck electrode 40a illustrated in (a-2") of FIG. 2 may include a step of applying the negative direct voltage to the chuck electrode 40a and a step of stopping the application of the negative direct voltage to the chuck electrode 40a, which steps are repeatedly performed. By repeating these steps, it is possible to further securely eliminate the electric charges from the chuck electrode 40a.

Further, as illustrated in (a-2') of FIG. 2, it is preferable to perform the second process where the positive direct voltage is applied to the chuck electrode 40a while eliminating the electric charges using the plasma of the process gas having the first gas pressure before the method of processing the substrate.

More specifically, it is preferable to perform the second process in a state where the electric charges are eliminated using the plasma of the process gas having the first gas pressure, wherein the second process includes a step of applying the positive direct voltage to the chuck electrode 40a while supplying the heat transfer gas having the third gas pressure to the surface of the wafer W, a step of stopping the supply of the heat transfer gas to the back surface of the wafer W, a step of stopping the application of the positive direct voltage to the chuck electrode 40a, and a step of applying the positive direct voltage again to the chuck electrode 40a.

With this, because the negative electric charges moved from the wafer W to the reaction product 41a are attracted on a side of the chuck electrode 40a having the positive electric charges, the electric charges are easily eliminated through the heat transfer gas and the gas supplying line 54 of the heat transfer gas in the first step illustrated in (a-2) of FIG. 2. Therefore, the processing time of the first process in step S100 can be shortened by performing the above process.

The third gas pressure is not specifically limited, may be the same as the gas pressure of the second gas pressure or different from the second gas pressure. Further, the third gas pressure may be changed during the process.

The second process may be repeatedly performed by multiple times. By repeating these steps, it is possible to further securely eliminate the electric charges from the chuck electrode 40a.

As described above, the step of applying the negative direct voltage to the chuck electrode 40a (step S1001) and the step of stopping the application of the negative direct voltage to the chuck electrode 40a (step S1002) may be performed between the second process and the first process.

Hereinafter, the present invention is described in more detail with reference to specific embodiments.

[First Embodiment]

According to a first embodiment, it is confirmed that the electric charges are effectively eliminated from the wafer W and the electrostatic chuck 40a by the method of processing the substrate of the embodiment.

The heat transfer gas was supplied to the back surface of the wafer W provided with the predetermined plasma process while the electric charges are eliminated using the plasma of the process gas. After a passage of a predetermined time from the supply of the heat transfer gas, the negative direct voltage was applied to the chuck electrode for a predetermined time and then the application of the negative direct voltage was stopped.

Detailed process conditions of processes of eliminating the electric charges of the first embodiment are as follows:
[Conditions of a Process of Completely Eliminating the Electric Charges]
Total processing time of the process of eliminating the electric charges: 186 seconds
[Conditions of a Process of Eliminating the Electric Charges]
Gas pressure of the process gas: 800 mTorr
Process gas: $Ar/O_2=1300/200$ sccm
[Conditions of Supplying the Heat Transfer Gas]
Type of the heat transfer gas: He
Gas pressure: 1 Torr
[Conditions of Applying the Negative Direct Voltage]
Value of the negative direct voltage: −3 kV
Time of applying the negative direct voltage: 50 seconds
Detailed process conditions of processes of eliminating the electric charges of a comparative example are as follows:
[Conditions of a Process of Completely Eliminating the Electric Charges]
Total processing time of the process of eliminating the electric charges: 70 seconds.
[Conditions of a Process of Eliminating the Electric Charges]
Gas pressure of the process gas: 800 mTorr Process gas: $Ar/O_2=1300/200$ sccm The evaluation of the method of processing the substrate (the method of eliminating the electric charges) was performed by measuring a rate (%) of change in a dechuck torque after the support pin contacts the back surface of the wafer until the wafer was separated from the mounting state when the wafer is lifted by the support pin after the process of eliminating the electric charges. In order to securely prevent a crack of the wafer at a time of lifting up the wafer, the rate of change of the dechuck torque is equal to or smaller than 20%, preferably equal to or smaller than 16%.

Further, the evaluation of the method of processing the substrate of the first embodiment (the method of eliminating the electric charges) was performed by measuring a misalignment of the wafer position relative to a transfer unit at a time of carrying the wafer W in or out the substrate processing apparatus. The time of carrying out means when the wafer carried in the substrate processing apparatus is carried out the substrate processing apparatus after the wafer is provided with the plasma process and the electric charge elimination process.

Within the first embodiment, the rate of change of the dechuck torque was 11.4% and the misalignment of the wafer position was 0.2 mm. Within the comparative example, the rate of change of the dechuck torque was 16% to 20% and the misalignment of the wafer position was 1 mm to 3 mm.

From these results, it was known that the method of processing the substrate of the first embodiment enabled electric charges in the wafer and the electrostatic chuck to be securely eliminated after the plasma process and the wafer was safely lifted from the electrostatic chuck.

[Second Embodiment]

According to a second embodiment, an effect caused by adding the step of applying the positive direct voltage to the chuck electrode is confirmed.

As a preprocess, the positive direct voltage was applied to the chuck electrode while supplying the heat transfer gas having a pressure of 5 Torr to the back surface of the wafer W provided with the predetermined plasma process.

After a passage of the predetermined time, the pressure of the heat transfer gas was depressurized to 1 Torr, and the supply of the heat transfer gas is stopped. Next, the application of the positive direct voltage was stopped. After the passage of a predetermined time, the positive direct voltage was applied again. These sequential steps were performed within about 5 seconds, and the repeated number of these sequential steps was 5.

Process conditions of the preprocess are as follows:
Gas pressure of the plasma process gas: 800 mTorr
Plasma process gas: $Ar/O_2=1300/200$ sccm
Type of the heat transfer gas: He
Gas pressure of the heat transfer gas: (5 Torr→1 Torr→0 Torr)×5 times
Value of the positive direct voltage: +2 kV The heat transfer gas was supplied to the back surface of the wafer W provided with the preprocess while the electric charges are eliminated using the plasma of the process gas. After a passage of a predetermined time from the supply of the heat transfer gas, the negative direct voltage was applied to the chuck electrode for a predetermined time and then the application of the negative direct voltage was stopped.

Detailed process conditions of the process of eliminating the electric charges including the preprocess are as follows:
[Conditions of a Process of Completely Eliminating the Electric Charges]
Total processing time of the process of eliminating the electric charges including the preprocess: 60 seconds (a preprocessing time is 5 seconds×5 times=25 seconds)
[Conditions of a Process of Eliminating the Electric Charges Using Plasma]
The gas pressure of the plasma process gas: 800 mTorr
Plasma process gas: $Ar/O_2=1300/200$ sccm
[Conditions of Supplying the Heat Transfer Gas]
Type of the heat transfer gas: He
The gas pressure of the process gas: 1 Torr
[Conditions of Applying the Negative Direct Voltage]
Value of the negative direct voltage: −3 kV
Time of applying the negative direct voltage: 20 seconds Within the second embodiment, in a manner similar to the first embodiment, the rate of change in the dechuck torque and the misalignment of the wafer position were measured. As a result, the rate of change of the dechuck torque was 15% and the misalignment of the wafer position was 0.2 mm to 0.5 mm.

Within the second embodiment, the processing time of the process of entirely eliminating the electric charges including the preprocess was 60 seconds as described above. From a comparison between the processing times of the processes of entirely eliminating the electric charges in the first and second embodiments, it is known that the processing time of the process of eliminating the electric charges could be drastically shortened by adding the step of applying the positive direct voltage to the chuck electrode.

In the method of processing the substrate of the second embodiment, the rate of change in the dechuck torque and the misalignment of the wafer position are sufficiently acceptable.

Thus, the method of processing the substrate of the embodiments of the present invention can separate the substrate from the electrostatic chuck.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of processing substrate have been described in detail, it should be understood that the various changes, substitutions, and alterations could be made hereto without departing from the spirit and scope of the invention.

What is claimed is:

1. A method of processing a substrate using a substrate processing apparatus that has an electrostatic chuck including an insulating member inside which an electrode is included and provides a plasma process to a substrate mounted on the electrostatic chuck, the method of processing the substrate comprising:
    a first process of supplying a heat transfer gas having a second gas pressure only to a back surface of the substrate without supplying a direct voltage to the electrode of the electrostatic chuck while eliminating electric charges in the substrate by means of plasma of a process gas having a first gas pressure.

2. The method of processing the substrate according to claim 1,
    wherein a ratio of the second gas pressure relative to the first gas pressure is greater than 0 and equal to or smaller than 1.25.

3. The method of processing the substrate according to claim 1,
    wherein the first process includes
        applying a negative direct voltage to the electrode, and
        stopping the applying the negative direct voltage to the electrode.

4. The method of processing the substrate according to claim 1, the method further comprising:
    a second process performed before the first process, the second process including
        applying a positive direct voltage to the chuck electrode while supplying the heat transfer gas having a third gas pressure onto the back surface of the substrate;
        stopping the supplying the heat transfer gas onto the back surface of the substrate;
        stopping the applying the positive direct voltage to the chuck electrode; and
        applying the positive direct voltage to the chuck electrode again.

5. The method of processing the substrate according to claim 4,
    wherein the second process is repeated a plurality of times.

6. The method of processing the substrate according to claim 4, the method further comprising:
    applying a negative direct voltage to the electrode between the first process and the second process; and
    stopping the applying the negative direct voltage to the electrode between the first process and the second process.

7. The method of processing the substrate according to claim 4, the method further include changing the third gas pressure while the positive direct voltage is being supplied to the chuck electrode.

8. The method of processing the substrate according to claim 4, the method further include reducing the third gas pressure in a stepwise manner while the positive direct voltage is being supplied to the chuck electrode.

* * * * *